(12) United States Patent
Shiiki et al.

(10) Patent No.: US 7,005,197 B2
(45) Date of Patent: Feb. 28, 2006

(54) LIGHT SOURCE AND DISPLAY USING THE SAME

(75) Inventors: Masatoshi Shiiki, Musashimurayama (JP); Choichiro Okazaki, Kodaira (JP); Teruki Suzuki, Funabashi (JP); Shin Imamura, Kokubunji (JP); Masaaki Komatsu, Kokubunji (JP); Hiromichi Yamada, Hino (JP)

(73) Assignee: Hitachi, Ltd., Tokyo (JP)

( * ) Notice: Subject to any disclaimer, the term of this patent is extended or adjusted under 35 U.S.C. 154(b) by 130 days.

(21) Appl. No.: 10/074,018

(22) Filed: Feb. 14, 2002

(65) Prior Publication Data

US 2003/0015955 A1      Jan. 23, 2003

(30) Foreign Application Priority Data

Jul. 17, 2001   (JP) ............................... 2001-216259

(51) Int. Cl.
H05B 33/14       (2006.01)
(52) U.S. Cl. ...................... 428/690; 428/917; 313/486; 313/503; 313/506
(58) Field of Classification Search ................ 428/690, 428/917, 1.1; 252/301.4 R; 257/98, 102, 257/103, 89, 184; 313/112, 503, 506, 486
See application file for complete search history.

(56) References Cited

U.S. PATENT DOCUMENTS

| | | | | |
|---|---|---|---|---|
| 5,202,777 A | * | 4/1993 | Sluzky et al. .................. | 349/27 |
| 5,469,018 A | * | 11/1995 | Jacobsen et al. ............ | 313/461 |
| 5,912,939 A | * | 6/1999 | Hirsch .......................... | 378/43 |
| 5,985,173 A | * | 11/1999 | Gray et al. ............ | 252/301.4 R |
| 5,998,925 A | * | 12/1999 | Shimizu et al. ............. | 313/503 |
| 6,066,861 A | * | 5/2000 | Hohn et al. .................... | 257/99 |
| 6,252,254 B1 | * | 6/2001 | Soules et al. ................. | 257/99 |
| 6,515,314 B1 | * | 2/2003 | Duggal et al. .............. | 257/184 |

FOREIGN PATENT DOCUMENTS

| | | |
|---|---|---|
| JP | 52-3627 | 1/1977 |
| JP | 54-34710 | 3/1979 |
| JP | 10-140150 | 5/1998 |
| JP | 10-269822 | 10/1998 |

OTHER PUBLICATIONS

Lopez, O.A, et al., "Fluorescence properties of polycrystalline Tm+3 activated Y3AI5O12 and Tm+3Li+ co-activated Y3AI5O12 the visible and near IR ranges", Jan. 1997, Journal of Luminescence, vol. 71, issue 1, pp. 1-11.*

* cited by examiner

Primary Examiner—Rena Dye
Assistant Examiner—Camie S. Thompson
(74) Attorney, Agent, or Firm—Mattingly, Stanger, Malur & Brundidge, P.C.

(57) ABSTRACT

The luminance of phosphor is enhanced by forming a phosphor screen of a fluorescence generation unit by phosphor expressed by the following composition formula: $(L_{1-a-b}Gd_aCe_b)_3(Al_{1-c}Ga_c)_5O_{12}:M_d$ wherein, a, b and c are each in the following ranges of $0 \leq a \leq 1.0$, $0 < b \leq 0.1$ and $0 \leq c \leq 1.0$, M is dopant of a monovalent metal element and is included in phosphor by approximately $0 < d \leq 1000$ wt-ppm. Dopant M of a monovalent metal element is at least one type of element selected from a group consisting of K, Na, Li, Cu, Ag and Au. Thus, a display using a white light of improved luminescence and having excellent characteristics can be realized.

7 Claims, 9 Drawing Sheets

LIGHT SOURCE AND DISPLAY USING THE SAME

BACKGROUND OF THE INVENTION

The present invention relates to a light source provided with an ultraviolet visible excitation light generation unit for generating first visible light and ultraviolet light and a fluorescence generation unit having a phosphor screen that generates second visible light when ultraviolet visible light generated from the excitation light generation unit irradiates the phosphor screen as excitation light and a display using the light for a light source for a liquid crystal display (a backlight of a liquid crystal display panel).

To display a color image on a liquid crystal display, a light source (a backlight) for a liquid crystal display is essential. Recently, the miniaturization and the enhancement of the quality of the light source are demanded. To enhance the quality of a liquid crystal display as a display, the quantity of white light emitted from a light source is required to be further enhanced.

To enhance the quality of an image and the luminance, the optimization of the color temperature of white light and the enhancement of a luminance saturation characteristic, a luminance degradation characteristic and a decay characteristic are required. The luminance saturation and degradation characteristic greatly differs depending upon the type, the manufacturing process, the dopant and the composition of phosphor material.

To improve these, the selection of phosphor having a better characteristic and the improvement of the composition and the manufacturing process have been discussed. To improve these defects, proposal that phosphor is excited by blue light from a blue light emitting diode (hereinafter called blue-LED) made of gallium nitride for example and white light is acquired is made and the practical use is discussed.

This is disclosed in Japanese published unexamined patent application No. Hei 10-269822 for example. It is known that at this time, for phosphor material, $(Y,Gd)_3(Al,Ga)_5O_{12}$:Ce phosphor the luminance degradation of which is small is used. This phosphor emits yellow-green light and white light can be acquired by mixing the yellow-green light and the blue light from the blue-LED.

However, there is a problem that the color temperature of the white light at this time is not enough and the quality of an image of a liquid crystal display is not enough. Therefore, there is a problem that for a white light source, a color reproduction area is small and particularly, the color purity of red is not satisfactory. Also, as it is important for a light source to maintain stable luminance for a long time, a luminance characteristic is also required to be improved.

SUMMARY OF THE INVENTION

Therefore, a first object of the invention is to provide a light source useful for a backlight for a liquid crystal display, particularly a white light source in which a fluorescence generation unit having Ce-doped rare-earth garnet phosphor which is excellent in a luminance characteristic, the luminous efficiency of which is improved and further, which is represented by $(Y,Gd)_3(Al,Ga)_5O_{12}$:Ce phosphor improved in white-color temperature by increasing a red emission component and an ultraviolet visible excitation light generation unit having an ultraviolet light component for exciting the phosphor and generating green light and a blue emission component are combined.

Further, a second object of the invention is to provide a liquid crystal display provided with the above-mentioned high-performance white light as a backlight and having high image quality and a display utilizing the liquid crystal display.

The first object can be achieved by the light source provided with the ultraviolet visible excitation light generation unit for generating first visible light and ultraviolet light and the fluorescence generation unit having a phosphor screen that generates second visible light when ultraviolet visible light generated from the ultraviolet visible excitation light generation unit irradiates the phosphor screen as excitation light for acquiring white light by mixing the first visible light from the ultraviolet visible excitation light generation unit and the second visible light from the fluorescence generation unit and characterized in that the phosphor screen includes phosphor expressed by the following composition formula.

Phosphor composition formula: $(L_{1-a-b}Gd_aCe_b)_3(Al_{1-c}Ga_c)_5O_{12}$:$M_d$ However, L is at least one type of rare-earth element selected from a group of La, Y, Lu and Sc, a, b and c are in each composition range of $0 \leq a < 1.0$, $0 < b \leq 0.1$ and $0 \leq c \leq 1.0$, M is dopant of a monovalent metal element and the content d is in a range of $0 < d \leq 1000$ wt-ppm.

Out of the above-mentioned compositions of phosphor, it is desirable that M which is dopant of a monovalent metal element is at least one type of monovalent metal element selected from a group of Li, Na, K, Cu, Ag and Au and above all, the composition including only K or K and another monovalent metal element is preferable. The M content d has effect that improves a luminance characteristic even if the content is slight and as described above, $0 < d \leq 1000$ wt-ppm, however, preferably, $50 \leq d \leq 500$ wt-ppm.

Doping M which is dopant of a monovalent metal element into phosphor can be performed by adding the sulfate and the borate of M such as potassium-sulfate and sodio-borate as flux by a predetermined amount when the phosphor is synthesized.

The phosphor expressed by the above-mentioned composition formula is characterized in that a $GdAlO_3$ diffraction line in an orientation of (211) has the intensity of 1/5 or less for a diffraction line in an orientation of (420) of the phosphor having the composition in the measurement of X-ray diffraction intensity using Kα-characteristic X-rays using Cu for material.

The ultraviolet visible excitation light generation unit of the light is formed by an ultraviolet light lamp, a blue-fluorescent lamp or an excitation light source having a visible light component and an ultraviolet light component such as blue-LED made of gallium nitride (GaN) the peak of emission of which is in the vicinity of 350 to 460 nm. It is desirable that the phosphor screen forming the fluorescence generation unit is formed so that the phosphor screen covers at least an emission surface of the excitation light source.

The second object can be achieved by a display provided with a liquid crystal display panel, a light source forming a backlight of the liquid crystal display panel and control means that controls visible light generated from the light source and displays image information on the liquid crystal display panel and characterized in that the light source is formed by a light source which can achieve the first object.

In the composition of the phosphor, doping a monovalent metal element has effect in the improvement of a luminance characteristic, that is, the enhancement of luminous efficiency (the enhancement of luminance), the content d is $0 < d \leq 1000$ wt-ppm as described above and preferably, $50 \leq d \leq 500$ wt-ppm as described above.

Doping the monovalent metal element also has action that prevents the deterioration of luminance when Gd is doped into the phosphor expressed by the above-mentioned composition formula to increase a red light component as described below and improve a characteristic of a white light source. The content a of Gd in the composition of the phosphor is in a range of $0 \leq a \leq 1.0$, however, to increase the red light component, it is desirable that the content a is particularly in a range of $0.3 \leq a \leq 0.8$. However, when Gd is doped, the luminance is deteriorated, however, the deterioration of the luminance can be prevented by doping a monovalent metal element.

In case phosphor in which Ce is doped into conventional type base material (a sample using prior art) $Y_3(Al_{1-z}Ga_z)_5O_{12}$ is used, green light is extremely strong fro red light in its emission spectrum and color temperature cannot be adjusted to the vicinity of 6000 K. However, a red light component can be increased by adding Gd to the base material. However, there is a problem that the luminance is extremely deteriorated by only doping Gd into the base material.

Then, as described above, Gd-substituted content in which the luminance is greatly improved can be acquired by adding a monovalent ion by a suitable amount. The light source according to the invention utilizing the phosphor screen using phosphor to which Gd is added as described above for the fluorescence generation unit can acquire satisfactory characteristics.

For emission intensity, the density of Ce which is the center of emission is important and if the density of Ce is adjusted so that it is in a range of $0 < b \leq 0.1$, the luminance can have a satisfactory characteristic.

High luminance is acquired by adding Ga together with Al. If the ratio of Al and Ga is adjusted so that the density c of Ga is in a range of $0.2 \leq c \leq 0.8$, the luminance can have a satisfactory characteristic.

Phosphor made of garnet as in the phosphor according to the invention and having composition close to that of the phosphor according to the invention is disclosed in Japanese published examined patent applications No. Sho 54-34710 and No. Sho 52-3627 and Japanese published unexamined patent application No. Hei 10-140150. However, the practical use of these phosphor is difficult for the following reasons.

The reason is that sufficient crystallinity is not acquired. This is caused by the manufacturing process. That is, for phosphor made of garnet like these phosphor, barium-fluoride has been mainly used for flux for assisting crystal growth in baking. In these phosphor, barium-fluoride is also used.

In case barium-fluoride is used for the synthesis of phosphor according to the invention, phosphor having sufficient crystallinity is not acquired. In the meantime, in the synthesis of phosphor according to the invention, a satisfactory crystal is acquired by using the sulfate and the borate of a monovalent metal element such as potassium-sulfate and sodio-borate for flux.

DESCRIPTION OF THE PREFERRED EMBODIMENTS

Figure 1:
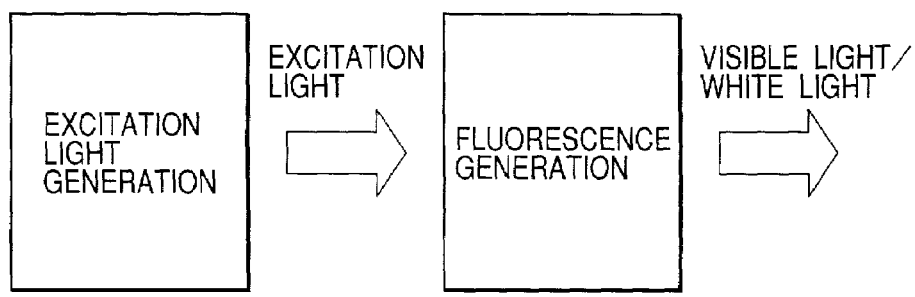
FIG. 1 is a conceptual drawing showing the configuration of a light equivalent to one embodiment of the invention.

Referring to the drawings, embodiments of the invention will be described in detail below.

First Embodiment

Phosphor Synthesis

For material, $Y_2O_3$, $Gd_2O_3$, $Ce_2(C_2O_4)_3 9H_2O$, $Al_2O_3$ or $Ga_2O_3$ was used and further, after for a component of flux, potassium-sulfate of 0.5 mol was added for 1-mol phosphor, a mixture of these was put in an alumina crucible and the crucible was capped, the crucible was baked in air at 1600° C. for three hours. A baked product was washed enough to remove the flux component. Further, the baked product was dried and phosphor powder was acquired. As a result, phosphor which can be expressed by a composition formula $(Y_{0.1}Gd_{0.89}Ce_{0.01})_3Al_2Ga_3O_{12}K$ was acquired. However, the content of potassium K in the composition formula is 150 wt-ppm.

Assembly of Light Source

After the phosphor power acquired as described above was dispersed in binder, it was uniformly applied on a plastic substrate, its solvent was evaporated at low temperature and a phosphor screen was formed. Next, an ultraviolet (UV) light lamp, a blue-fluorescent lamp or ultraviolet- or blue-LED which were an excitation light source and the phosphor screen were combined and a light source was acquired.

Afterward, when power was supplied to the excitation light source and excitation light was generated, yellow-green light was acquired from the phosphor screen and in case the blue-fluorescent lamp and the blue-LED were combined, white light was observed.

FIG. 1 is a conceptual drawing showing a light source according to the invention. The light source is composed of an excitation light generation unit for generating excitation light (ultraviolet rays) for exciting phosphor and first visible light and a fluorescence generation unit for generating second visible light (yellow-green light) by the excitation light.

Figure 2:
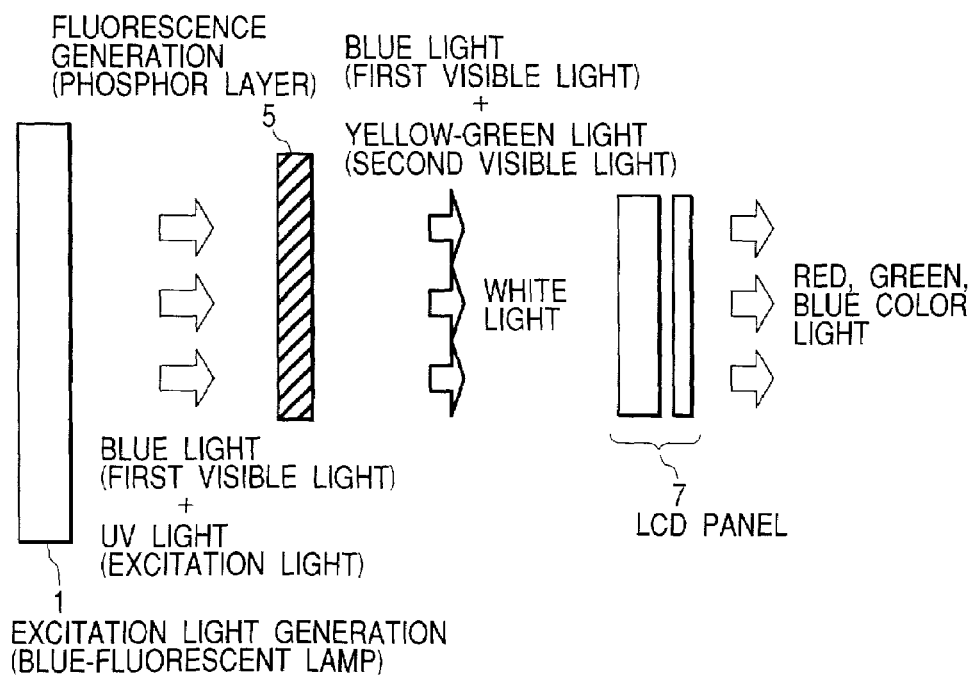
FIG. 2 shows the configuration of the light using a blue-fluorescent lamp in one embodiment of the invention.
Figure 3:
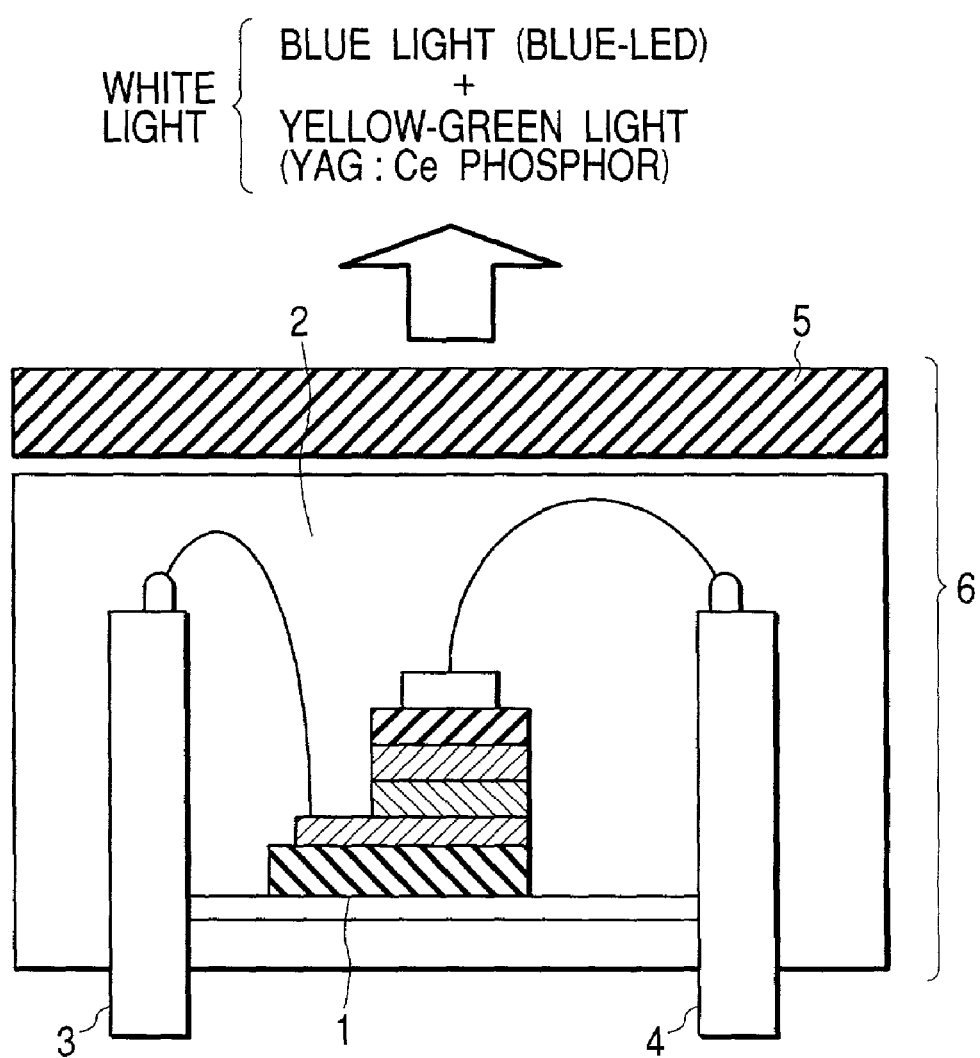
FIG. 3 shows the configuration of the light using blue-LED in one embodiment of the invention.

FIG. 2 is a block diagram showing one configurational example of a liquid crystal display in which a blue-fluorescent lamp is used for the excitation light generation unit 1 and white light from the light source that utilizes the phosphor screen for the fluorescence generation unit 5 irradiates the back of a liquid crystal display panel 7 as backlight. Further, FIG. 3 is a schematic sectional view showing a configurational example of a light source 6 in case blue-LED is used for the excitation light generation unit 1. A reference number 1 in FIG. 3 denotes the blue-LED, 3 and 4 denote power supply terminals for supplying power to the blue-LED and 2 denotes a light diffusion layer.

Figure 4:
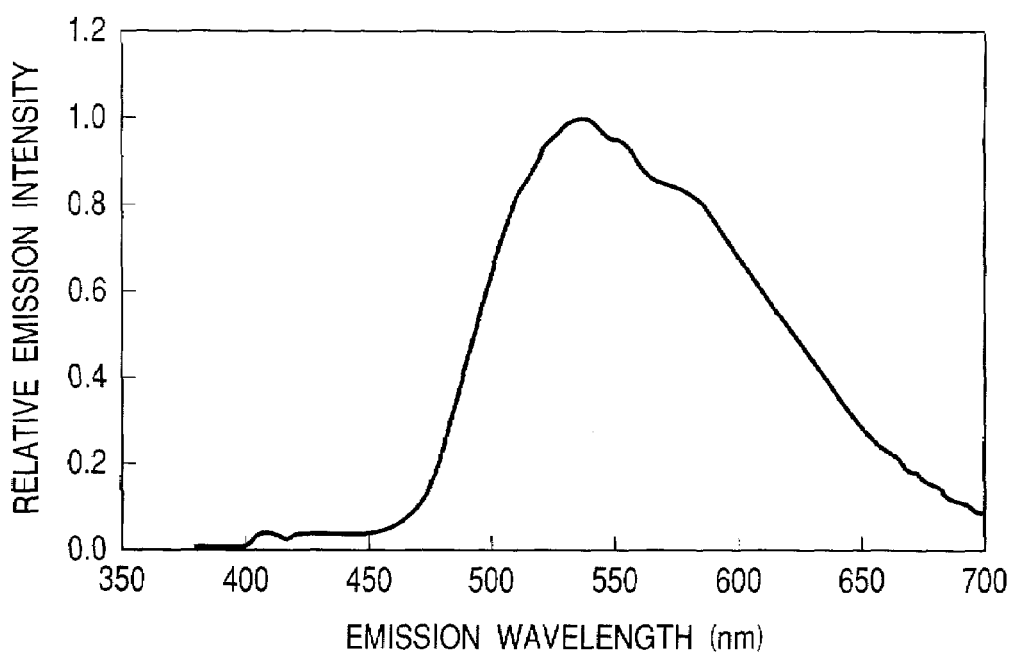
FIG. 4 shows an emission spectrum of phosphor in a fluorescence generation unit in one embodiment of the invention.
Figure 5:
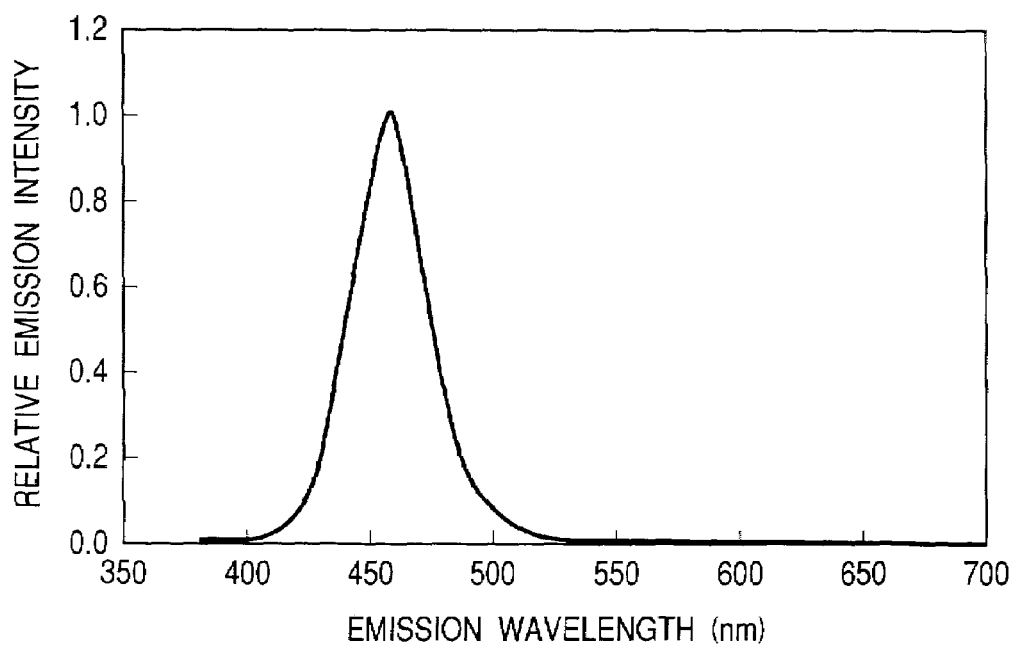
FIG. 5 shows an emission spectrum of blue-LED used in an excitation light generation unit in one embodiment of the invention.
Figure 6:
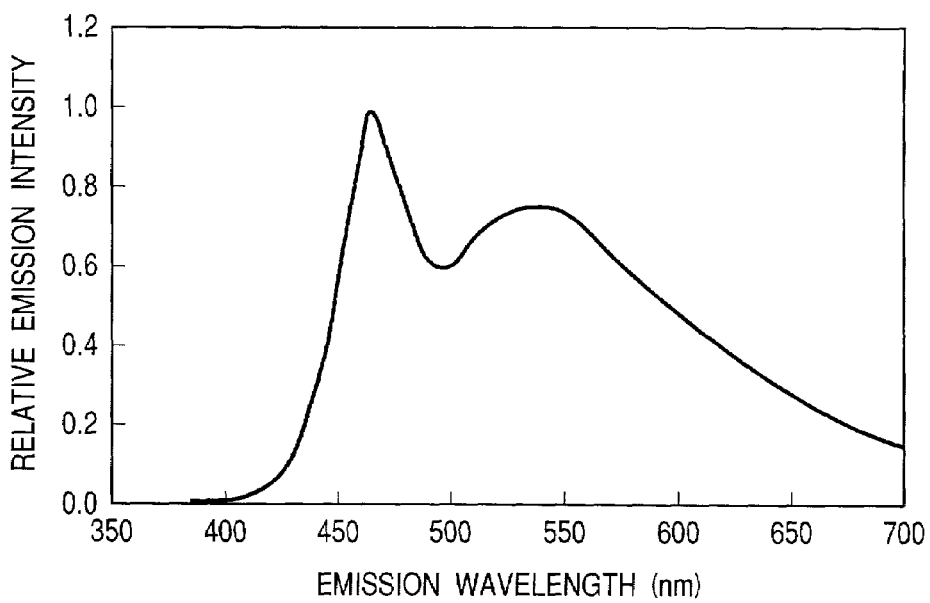
FIG. 6 shows an emission spectrum of a white light in one embodiment of the invention.

FIG. 4 shows an emission spectrum of phosphor in the fluorescence generation unit, FIG. 5 shows an emission spectrum of the blue-LED and FIG. 6 shows an emission spectrum of a white light source acquired by synthesizing the emission spectrum of the phosphor shown in FIG. 4 and the emission spectrum of the blue-LED shown in FIG. 5.

Second Embodiment

The performance of the phosphor screen was evaluated using the light source 6 in the configurational example shown in FIG. 3. However, the evaluation of the phosphor screen was performed in a state that the blue-LED 1 and the phosphor screen 5 were separated.

Figure 7:
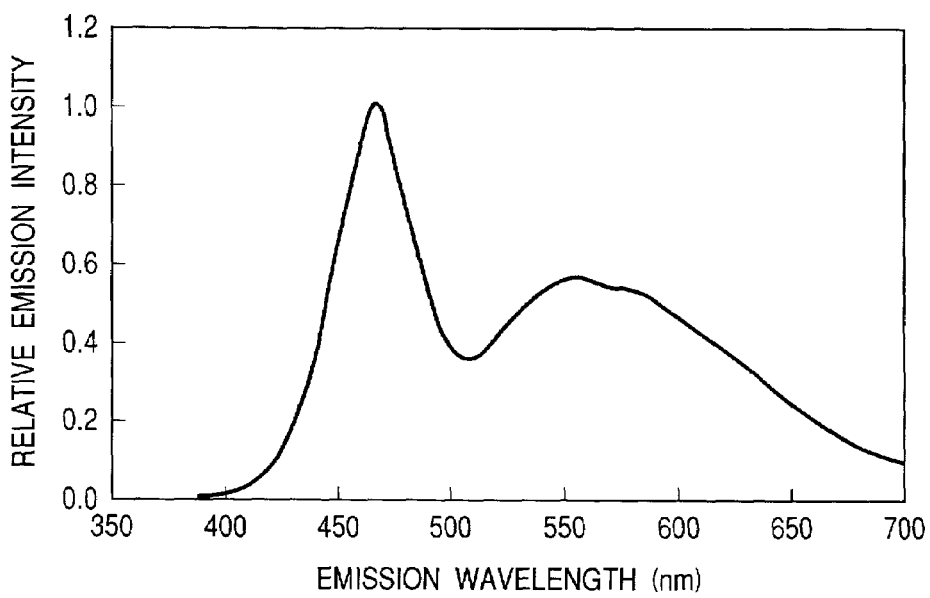
FIG. 7 shows an emission spectrum of a white light in one embodiment of the invention.

A phosphor screen expressed by a different composition formula $(Y_{0.5-b}Gd_{0.5}Ce_b)_3Al_2Ga_3O_{12}$ the density of Ce of which was b was produced by such a method and an excitation emission characteristic was evaluated using the blue-LED having the emission spectrum shown in FIG. 5 in the first embodiment. In that case, the density of Ce was 0.04 and for a metal element, potassium K was added by 500 wt-ppm. FIG. 7 shows an emission spectrum of a white light source depending upon excitation by the blue-LED.

Figure 8:
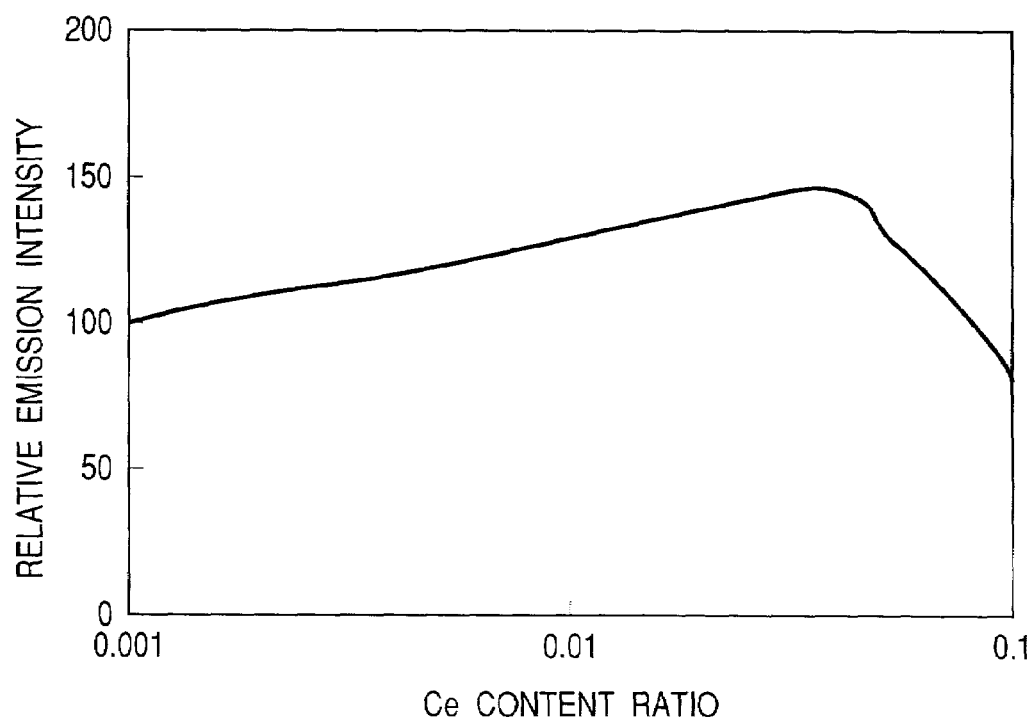
FIG. 8 shows the dependency upon Ce content ratio b of the emission intensity of the fluorescence generation unit in one embodiment of the invention.

The density b of Ce has dependency shown in FIG. 8, shows a satisfactory emission characteristic in a range of 0.001 to 0.08 and particularly, when the density b of Ce is 0.01 to 0.05, the emission intensity becomes maximum.

In case the variation of the density was observed using $Ce_2O_3$ for the material of Ce, substantially the similar emission characteristic was also acquired. The dependency of the density b of Ce shown in FIG. 8 varies depending upon crystal structure and a synthesis condition.

Third Embodiment

For material for the synthesis of phosphor, $Gd_2O_3$, $Ce_2(C_2O_4)_3 \cdot 9H_2O$, $Al_2O_3$ or $Ga_2O_3$ was used, further, for a flux component, potassium-nitrate, potassium-carbonate or barium-fluoride ($BaF_2$) was used in place of potassium-sulfate in the first embodiment, phosphor having the composition of $(Gd_{0.99}Ce_{0.01})_3Al_2Ga_3O_{12}$ was baked by the similar baking method to that in the first embodiment and further, phosphor screens were produced. In case potassium-nitrate was used, that of 0.6 mol was added for generated 1-mol phosphor or in case potassium-carbonate was used, that of 0.8 mol was added. In both cases, the content of potassium in phosphor is approximately 150 wt-ppm.

Figure 9:
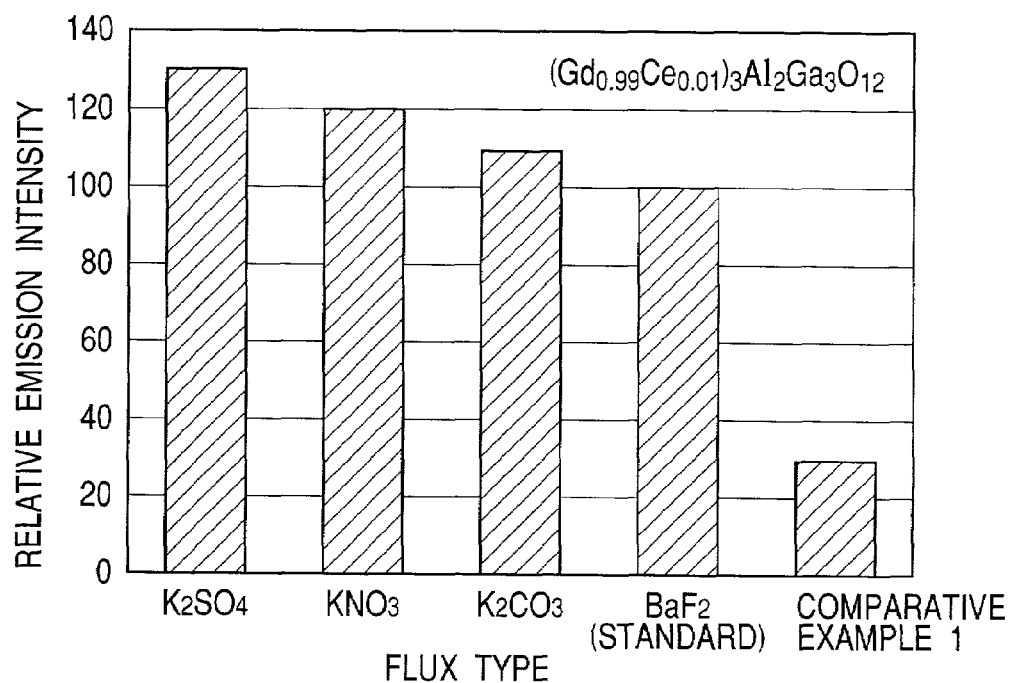
FIG. 9 shows relation between each flux component and emission intensity in one embodiment of the invention.
Figure 10:
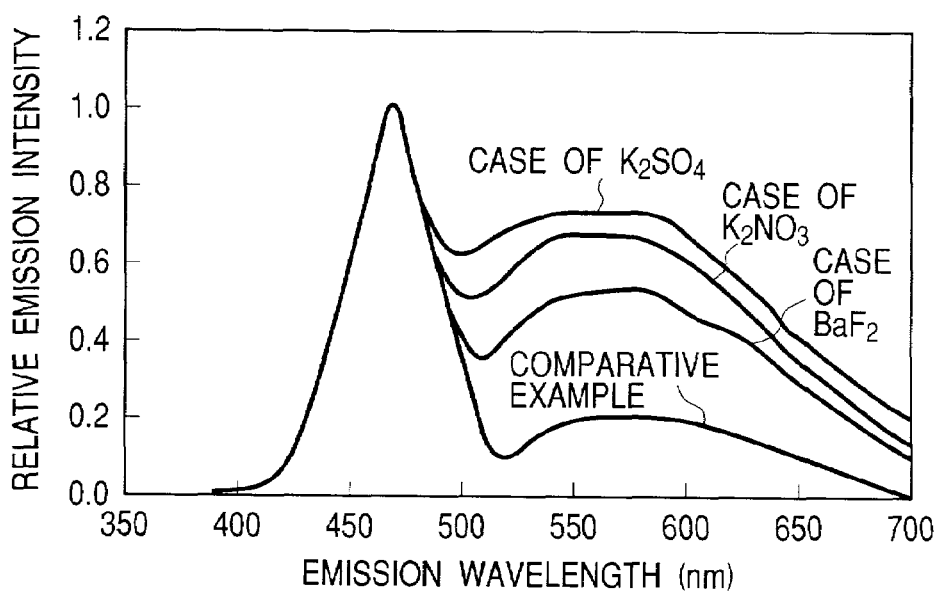
FIG. 10 shows the variation among flux components of the emission spectrum of the white light in one embodiment of the invention.

For these phosphor screens, an emission characteristic by excitation by blue-LED as in the second embodiment was also evaluated. FIG. 9 shows the result. FIG. 10 shows an emission spectrum of acquired typical phosphor.

COMPARATIVE EXAMPLE

Material for the synthesis of phosphor is the same as that in the third embodiment and in a first comparative example, phosphor having the composition of $(Gd_{0.99}Ce_{0.01})_3Al_2Ga_3O_{12}$ was baked without using a flux component by the similar baking method as that in the first embodiment and further, a phosphor screen was produced. For the phosphor screen, an emission characteristic by excitation by blue-LED as in the second embodiment was also evaluated. FIG. 9 shows the result.

In a second comparative example, for a flux component, barium-fluoride of 0.2 mol was added for generated 1-mol phosphor, a phosphor screen was manufactured by the similar method to that in the first comparative example and an emission characteristic by excitation by blue-LED as in the second embodiment was evaluated. FIG. 9 shows the result.

As clear from FIG. 9, the emission intensity of acquired phosphor is particularly high in the case of baking using flux. It was found that particularly in case potassium salt was used for a flux component, a further high emission intensity (equivalent to 1.1 to 1.3 times) was acquired, compared with a case that barium-fluoride ($BaF_2$) generally used in a process for baking yttrium-aluminum-garnet (YAG) phosphor was used. It can be said that the emission intensity of phosphor in this embodiment which is equivalent to 1.1 to 1.3 times, compared with that of barium-fluoride in the second comparative example is an extraordinary characteristic in this type of phosphor.

Fourth Embodiment

For the material of phosphor, $Gd_2O_3$, $Ce_2(C_2O_4)_3 \cdot 9H_2O$, $Al_2O_3$ or $Ga_2O_3$ was used as in the third embodiment, for a flux component, potassium-sulfate (in this embodiment) or barium-fluoride ($BaF_2$) (in the second comparative example) was used, phosphor having the composition of $(Gd_{0.99}Ce_{0.01})_3 Al_2Ga_3O_{12}$ was baked by the similar baking method to that in the first embodiment and further, phosphor screens were produced. Flux in a range of 1/100 mol of the number in mol of a product made of the above-mentioned material to 2 mol was added. Potassium-sulfate of 0.5 mol was added and K content was 150 ppm.

Figure 11:
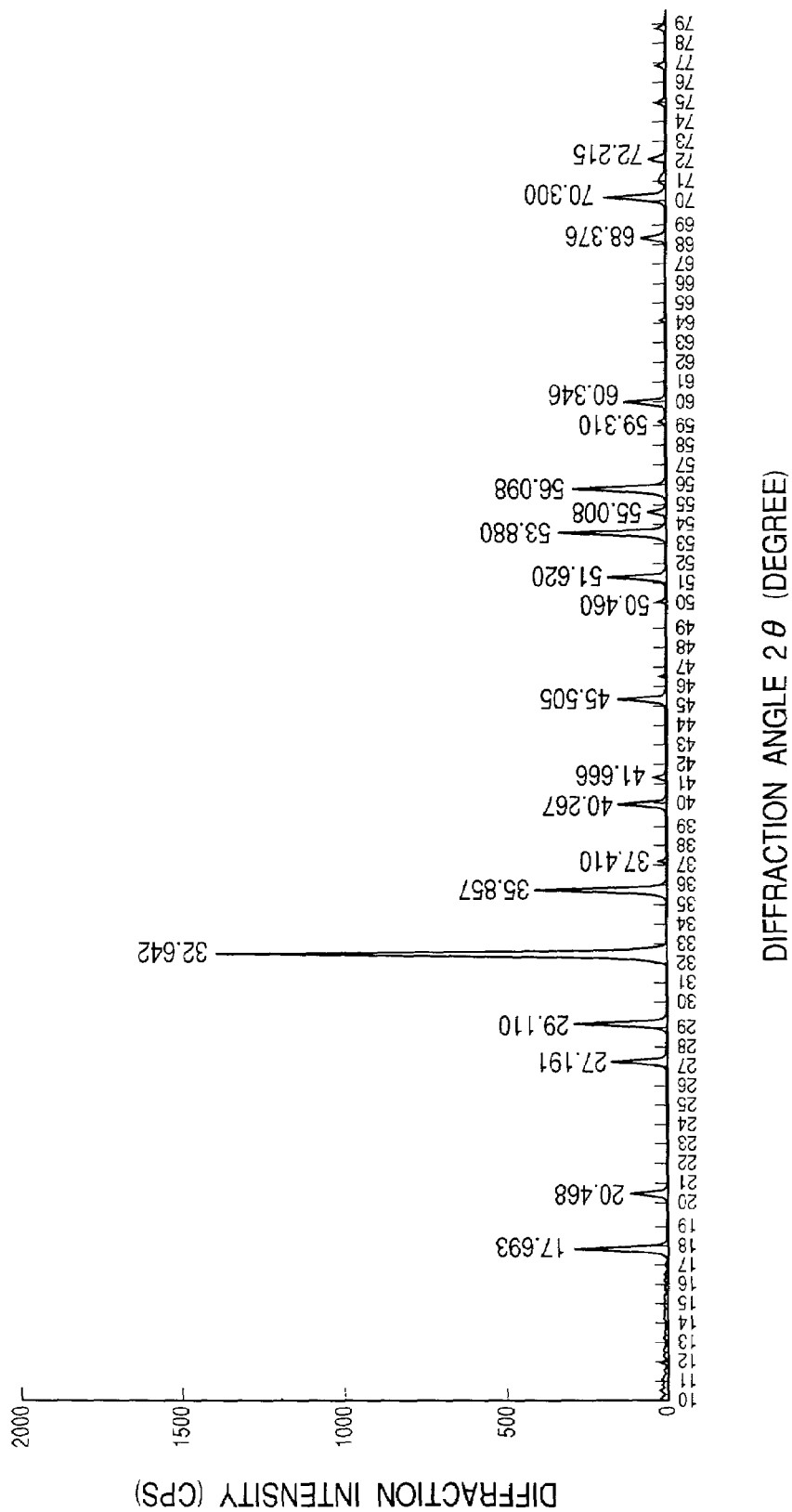
FIG. 11 shows an X-ray diffraction pattern of phosphor using potassium-sulfate for a flux component in one embodiment of the invention.
Figure 12:
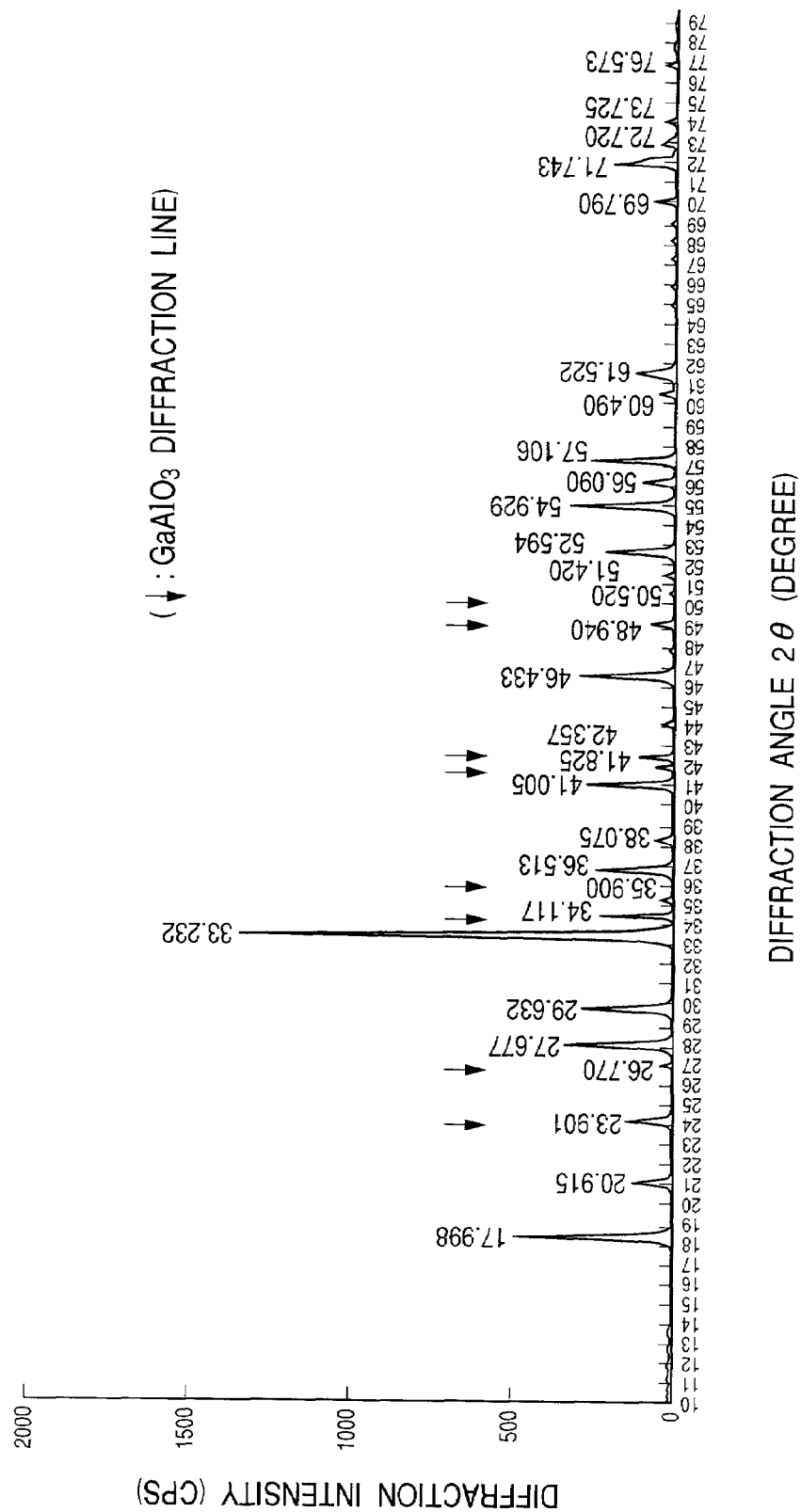
FIG. 12 shows an X-ray diffraction pattern of phosphor using barium-fluoride for a flux component in one embodiment of the invention.

FIG. 11 shows a pattern of X-ray diffraction intensity measured on phosphor in case potassium-sulfate is used for flux using characteristic X-rays K α using Cu for material. FIG. 12 shows a pattern of diffraction intensity in case $BaF_2$ is used for flux.

As shown in FIG. 12, in case $BaF_2$ is used for flux, a $GdAlO_3$ diffraction line appears as an out-of-phase component, however, in FIG. 11, in case potassium-sulfate is used for flux, a $GdAlO_3$ diffraction line hardly appears. This becomes clear if a $GdAlO_3$ diffraction line in an orientation of (211) which exists on the larger side of "2θ=32 to 34° C. and a $(Gd_{0.99}Ce_{0.01})_3Al_2Ga_3O_{12}$ diffraction line in an orientation of (420) which exists on the smaller side are compared.

That is, in FIG. 12, the $GdAlO_3$ diffraction line in the orientation of (211) appears at intensity equivalent to approximately 1/5 of the $(Gd_{0.99}Ce_{0.01})_3Al_2Ga_3O_{12}$ diffraction line in the orientation of (420). In the meantime, in FIG. 11, the $(Gd_{0.99}Ce_{0.01})_3Al_2Ga_3O_{12}$ diffraction line in the orientation of (420) appears at substantially the similar intensity to that in FIG. 12, however, no $GdAlO_3$ diffraction line in an orientation of (211) appears. In case the content of potassium-sulfate which is a flux component was varied in the range of 1/100 mol to 2 mol, the ratio of intensity was always smaller than 1/5.

Fifth Embodiment

Figure 13:
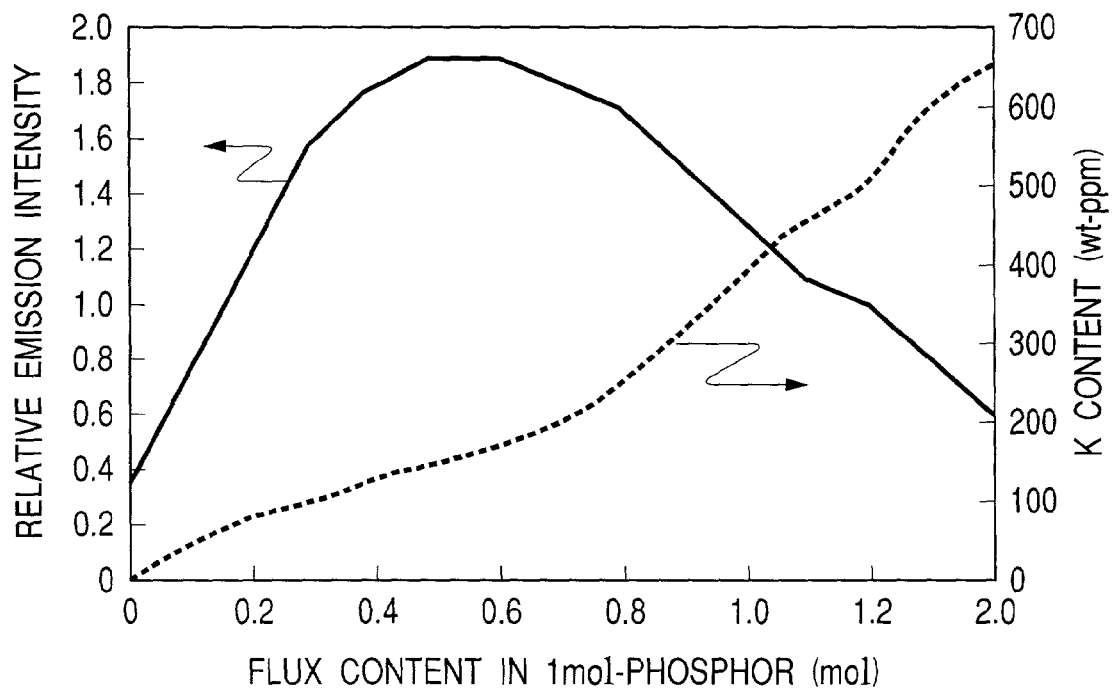
FIG. 13 shows relation between the added amount of flux in case potassium-sulfate is used for the flux component and emission intensity in one embodiment of the invention.

For a flux component, potassium-sulfate was used, the content was varied, phosphor having the composition of $(Gd_{0.99}Ce_{0.01})_3Al_2Ga_3O_{12}$ was baked in a state in which the others were similar to those in the first embodiment and further, phosphor screens were produced. The emission characteristic by excitation by blue-LED as in the second embodiment of these phosphor screens was evaluated. FIG. 13 shows the result.

FIG. 13 also shows the K content (wt-ppm) of each sample. As also clear from FIG. 13, the K content of phosphor increases substantially in proportion to flux content and emission intensity increases in a range in which the content is 50 to 500 wt-ppm.

Sixth Embodiment

For a flux component, barium-fluoride ($BaF_2$) was used, potassium was added in the form of KCl, the added amount was varied, phosphor having the composition of $(Gd_{0.99}Ce_{0.01})_3Al_2Ga_3O_{12}$ was baked in a state in which the others were similar to those in the first embodiment and further, phosphor screens were produced. The emission characteristic by excitation by blue-LED as in the second embodiment of these phosphor screens was evaluated.

In this case, K content included in phosphor can be varied independent of the quantity of flux. The K content increased substantially in proportion to the added amount of KCl. In a range up to 1000 wt-ppm of the K content d, the enhancement of the emission intensity by the dopant was recognized, compared with a case that no potassium was added (the K content is substantially zero).

Seventh Embodiment

For a flux component, barium-fluoride ($BaF_2$) was used, next, Li, Na, Cu, Ag or Au except potassium was sequentially added as a monovalent metal element (the added amount was 100 wt-ppm and fixed), phosphor having the composition of $(Gd_{0.99}Ce_{0.01})_3Al_2Ga_3O_{12}$ was baked in a state in which the others were similar to those in the first embodiment and further, phosphor screens were produced. The emission characteristic by excitation by blue-LED as in the second embodiment of these phosphor screens was evaluated.

In any case, the content of each element included in the baked phosphor is substantially 100 wt-ppm and in any case, the enhancement of the emission intensity by the dopant was recognized, compared with a case that no monovalent metal element was doped (the K content is substantially zero). In any case, the emission spectrum of the acquired phosphor was substantially the same as that in the third embodiment.

According to the invention, the phosphor and a high quality of display respectively suitable for high-quality display can be acquired.

What is claimed is:

1. A light source provided with an ultraviolet visible excitation light generation unit that generates first visible light and ultraviolet light and a fluorescence generation unit having a phosphor screen that generates second visible light when ultraviolet visible light generated from the ultraviolet visible excitation light generation unit irradiates the phosphor screen as excitation light for acquiring white light by mixing the first visible light from the ultraviolet visible excitation light generation unit and the second visible light from the fluorescence generation unit, wherein:

the phosphor screen includes phosphor expressed by the following composition formula, the phosphor composition formula: $(L_{1-a-b}Gd_aCe_b)_3(Al_{1-c}Ga_c)_5O_{12}:M_d$ wherein, L is at least one type of rare-earth element selected from a group of La, Y, Lu and Sc, a, b and c are each in the following composition ranges of $0 \leq a < 1.0$, $0 < b \leq 0.1$ and $0 \leq c \leq 1.0$, M is dopant of a monovalent metal element selected from a group consisting of Li, Na, K, Cu, Ag and Au and the content d is in a range of $0 < d \leq 1000$ wt-ppm.

2. A light source according to claim 1, wherein: the content d is in a range of $50 \leq d \leq 500$ wt-ppm.

3. A light source according to claim 1, wherein:

a $GdAlO_3$ diffraction line in an orientation of (211) of phosphor expressed by the composition formula has intensity of 1/5 or less for a diffraction line in an orientation of (420) of the phosphor having the composition in the measurement of X-ray diffraction intensity using Kα-characteristic X-rays using Cu for material.

4. A display provided with a liquid crystal display panel, a light source forming a backlight of the liquid crystal display panel and control means that controls visible light generated from the light source and displays image information on the liquid crystal display panel, wherein:

the light source is provided with an ultraviolet visible excitation light generation unit that generates first visible light and ultraviolet light and a fluorescence generation unit having a phosphor screen that generates second visible light when ultraviolet visible light generated from the ultraviolet visible excitation light generation unit irradiates the phosphor screen as excitation light so as to acquire white light by mixing the first visible light from the ultraviolet visible excitation light generation unit and the second visible light from the fluorescence generation unit; and the phosphor screen includes phosphor expressed by the following composition formula, the phosphor composition formula: $(L_{1-a-b}Gd_aCe_b)_3(Al_{1-c}Ga_c)_5O_{12}:M_d$ wherein, L is at least one type of rare-earth element selected from a group of La, Y, Lu and Sc, a, b and c are each in the following composition ranges of $0 \leq a < 1.0$, $0 < b \leq 0.1$ and $0 \leq c \leq 1.0$, M is dopant of a monovalent metal element selected from a group consisting of Li, Na, K, Cu, Ag and Au and the content d is in a range of $0 < d \leq 1000$ wt-ppm.

5. A light source provided with an ultraviolet visible excitation light generation unit that generates first visible light and ultraviolet light and a fluorescence generation unit having a phosphor screen that generates second visible light when ultraviolet visible light generated from the excitation light generation unit irradiates the phosphor screen as excitation light for acquiring white light by mixing the first visible light from the ultraviolet visible excitation light generation unit and the second visible light generated from the fluorescence generation unit, wherein:

the phosphor screen includes phosphor expressed by the following composition formula, the phosphor composition formula: $(L_{1-a-b}Gd_aCe_b)_3(Al_{1-c}Ga_c)_5O_{12}:M_d$ wherein, L is at least one type of rare-earth element selected from a group of La, Y, Lu and Sc, a, b and c are each in the following composition ranges of $0 \leq a < 1.0$, $0 < b \leq 0.1$ and $0 \leq c \leq 1.0$, M is the element potassium (K) selected and the content d is in a range of $50 \leq d \leq 500$ wt-ppm.

6. A light source according to claim 5, wherein:
a $GdAlO_3$ diffraction line in an orientation of (211) of phosphor expressed by the composition formula has intensity of 1/5 or less for a diffraction line in an orientation of (420) of the phosphor having the composition in the measurement of X-ray diffraction intensity using Kα-characteristic X-rays using Cu for material.

7. A display provided with a liquid crystal display panel, a light source forming a backlight of the liquid crystal display panel and control means that controls visible light generated from the light source and displays image information on the liquid crystal display panel, wherein:
the light source is provided with an ultraviolet visible excitation light generation unit that generates first visible light and ultraviolet light and a fluorescence generation unit having a phosphor screen that generates second visible light when ultraviolet visible light generated from the excitation light generation unit irradiates the phosphor screen as excitation light so as to acquire white light by mixing the first visible light from the ultraviolet visible excitation light generation unit and the second visible light from the fluorescence generation unit; and
the phosphor screen includes phosphor expressed by the following composition formula,
the phosphor composition formula: $(L_{1-a-b}Gd_aCe_b)_3(Al_{1-c}Ga_c)_5O_{12}:M_d$
wherein, L is at least one type of rare-earth element selected from a group of La, Y, Lu and Sc, a, b and c are each in the following composition ranges of $0 \leq a < 1.0$, $0 < b \leq 0.1$ and $0 \leq c \leq 1.0$, M is the element potassium (K) selected and the content d is in a range of $50 \leq d \leq 500$ wt-ppm.

* * * * *